United States Patent
Hiroi et al.

(10) Patent No.: US 8,421,010 B2
(45) Date of Patent: Apr. 16, 2013

(54) CHARGED PARTICLE BEAM DEVICE FOR SCANNING A SAMPLE USING A CHARGED PARTICLE BEAM TO INSPECT THE SAMPLE

(75) Inventors: Takashi Hiroi, Yokohama (JP); Yasuhiro Gunji, Hitachiota (JP); Hiroshi Miyai, Hitachi (JP); Masaaki Nojiri, Hitachinaka (JP)

(73) Assignee: Hitachi High-Technologies Corporation, Tokyo (JP)

( * ) Notice: Subject to any disclaimer, the term of this patent is extended or adjusted under 35 U.S.C. 154(b) by 0 days.

(21) Appl. No.: 13/061,031

(22) PCT Filed: Aug. 28, 2009

(86) PCT No.: PCT/JP2009/004205
§ 371 (c)(1),
(2), (4) Date: Feb. 25, 2011

(87) PCT Pub. No.: WO2010/029700
PCT Pub. Date: Mar. 18, 2010

(65) Prior Publication Data
US 2011/0163230 A1    Jul. 7, 2011

(30) Foreign Application Priority Data
Sep. 12, 2008 (JP) ............... 2008-234270

(51) Int. Cl.
*A61N 5/00* (2006.01)
*G21K 5/04* (2006.01)

(52) U.S. Cl.
USPC ............ 250/310; 250/306; 250/307; 250/311

(58) Field of Classification Search ............ 250/310
See application file for complete search history.

(56) References Cited

U.S. PATENT DOCUMENTS 6,252,412 B1    6/2001    Talbot et al.
6,388,747 B2 *  5/2002    Nara et al. ........... 356/394

(Continued)

FOREIGN PATENT DOCUMENTS

JP    2000-161932    6/2000
JP    2000-208576    7/2000

(Continued)

OTHER PUBLICATIONS

T. Hiroi et al., "Robust Defect Detection System Using Double Reference Image Averaging for High Throughput SEM Inspection Tool," 2006 IEEE/SEMI Advanced Semiconductor Manufacturing Conference, pp. 347-352.

(Continued)

*Primary Examiner* — David A Vanore
(74) *Attorney, Agent, or Firm* — McDermott Will & Emery LLP

(57) ABSTRACT

There is provided a substrate inspection device which uses a charged particle beam and is capable of more quickly extracting a defect candidate than ever before. The configuration of the substrate inspection device is such that a substrate having a circuit pattern is irradiated with a primary charged particle beam, the substrate is moved at a constant speed or at an increasing or a decreasing speed, a position resulting from the movement is monitored, the position of irradiation with the primary charged particle beam is controlled according to the coordinates of the substrate, an image in a partial region on the substrate is captured at a speed lower than the velocity of the movement, a defect candidate is detected based on the captured image, and the detected defect candidate is displayed in a map format.

10 Claims, 11 Drawing Sheets

U.S. PATENT DOCUMENTS

| | | | |
|---|---|---|---|
| 6,421,122 B2* | 7/2002 | Nara et al. | 356/394 |
| 6,476,913 B1* | 11/2002 | Machida et al. | 356/394 |
| 6,480,279 B2* | 11/2002 | Nara et al. | 356/394 |
| 6,493,082 B2* | 12/2002 | Nara et al. | 356/394 |
| 6,504,609 B2* | 1/2003 | Nara et al. | 356/394 |
| 6,509,750 B1 | 1/2003 | Talbot et al. | |
| 6,538,249 B1* | 3/2003 | Takane et al. | 850/9 |
| 6,567,168 B2* | 5/2003 | Nara et al. | 356/394 |
| 6,653,633 B2* | 11/2003 | Takane et al. | 850/10 |
| 6,753,518 B2* | 6/2004 | Watanabe et al. | 250/201.3 |
| 6,759,655 B2* | 7/2004 | Nara et al. | 850/9 |
| 6,838,667 B2* | 1/2005 | Tsuneta et al. | 850/10 |
| 6,903,821 B2* | 6/2005 | Nara et al. | 356/394 |
| 6,914,441 B2 | 7/2005 | Talbot et al. | |
| 6,919,564 B2* | 7/2005 | Nara et al. | 850/10 |
| 6,936,818 B2* | 8/2005 | Takane et al. | 850/1 |
| 7,026,830 B2* | 4/2006 | Shinada et al. | 324/754.22 |
| 7,034,296 B2* | 4/2006 | Sato et al. | 250/307 |
| 7,109,483 B2* | 9/2006 | Nakasuji et al. | 250/310 |
| 7,109,485 B2* | 9/2006 | Takane et al. | 250/310 |
| 7,138,629 B2* | 11/2006 | Noji et al. | 250/311 |
| 7,164,126 B2* | 1/2007 | Sato et al. | 250/310 |
| 7,223,975 B2* | 5/2007 | Nara et al. | 250/310 |
| 7,263,216 B2* | 8/2007 | Shishido et al. | 382/149 |
| 7,292,327 B2* | 11/2007 | Nara et al. | 356/237.2 |
| 7,329,868 B2* | 2/2008 | Takane et al. | 250/310 |
| 7,329,889 B2* | 2/2008 | Watanabe et al. | 250/559.3 |
| 7,361,894 B2* | 4/2008 | Sato et al. | 250/306 |
| 7,365,324 B2* | 4/2008 | Noji et al. | 250/310 |
| 7,417,444 B2* | 8/2008 | Shinada et al. | 324/754.22 |
| 7,420,167 B2* | 9/2008 | Okuda et al. | 250/310 |
| 7,642,514 B2* | 1/2010 | Takane et al. | 250/310 |
| 7,692,144 B2* | 4/2010 | Watanabe et al. | 250/307 |
| 7,696,487 B2* | 4/2010 | Hayakawa et al. | 250/397 |
| 7,838,828 B2* | 11/2010 | Ominami et al. | 250/306 |
| 7,952,074 B2* | 5/2011 | Shinada et al. | 250/311 |
| 8,036,447 B2* | 10/2011 | Hayakawa et al. | 382/145 |
| 8,134,697 B2* | 3/2012 | Hayakawa et al. | 356/141.4 |
| 2001/0011706 A1 | 8/2001 | Nara et al. | |
| 2001/0015805 A1 | 8/2001 | Nara et al. | |
| 2001/0019411 A1 | 9/2001 | Nara et al. | |
| 2001/0021019 A1 | 9/2001 | Nara et al. | |
| 2001/0021020 A1 | 9/2001 | Nara et al. | |
| 2002/0105648 A1 | 8/2002 | Nara et al. | |
| 2002/0109088 A1 | 8/2002 | Nara et al. | |
| 2002/0113967 A1 | 8/2002 | Nara et al. | |
| 2002/0134936 A1 | 9/2002 | Matsui et al. | |
| 2003/0058444 A1 | 3/2003 | Nara et al. | |
| 2003/0062487 A1 | 4/2003 | Hiroi et al. | |
| 2003/0063792 A1 | 4/2003 | Hiroi et al. | |
| 2005/0200841 A1 | 9/2005 | Talbot et al. | |
| 2009/0224151 A1 | 9/2009 | Hatakeyama et al. | |

FOREIGN PATENT DOCUMENTS

| | | |
|---|---|---|
| JP | 2001-147114 | 5/2001 |
| JP | 2001-148016 | 5/2001 |
| JP | 2002-026093 | 1/2002 |
| JP | 2005-274172 | 10/2005 |
| JP | 2007-180090 A | 7/2007 |
| JP | 2008-173297 A | 7/2008 |
| JP | 2008-252085 A | 10/2008 |
| KR | 10-2008-0036145 A | 4/2008 |
| KR | 10-0960823 | 6/2010 |

OTHER PUBLICATIONS

M. Ikota et al., "In-line e-beam inspection with optimized sampling and newly developed ADC," Proceedings of SPIE vol. 5041 (2003), pp. 50-60.

Japanese Office Action, w/ partial English translation thereof, issued in Japanese Patent Application No. 2008-234273 dayed Jul. 3, 2012.

English translation of Korean Office Action issued in Korean Patent Application No. KR 10-2011-7003654 dated Aug. 14, 2012.

Japanese Office Action issued Jan. 15, 2013 in corresponding to Japanese patent application No. 2008-234270 and partial English translation.

\* cited by examiner

PROCEDURE FOR CREATING RECIPE

PROCEDURE FOR INSPECTION

| LINE SCANNING ORDER | LINE NUMBER |
|---|---|
| 1 | |
| 2　5 | |
| 3　6　9 | |
| 4　7　10　13 | [1] |
| 　8　11　14　17 | [2] |
| 　　12　15　18　21 | [3] |
| 　　　16　19　22　25 | [4] |
| 　　　　20　23　26 | [5] |
| 　　　　　24　27 | [6] |

CHARGED PARTICLE BEAM DEVICE FOR SCANNING A SAMPLE USING A CHARGED PARTICLE BEAM TO INSPECT THE SAMPLE

RELATED APPLICATIONS

This application is the U.S. National Phase under 35 U.S.C. §371 of International Application No. PCT/JP2009/004205, filed on Aug. 28, 2009, which in turn claims the benefit of Japanese Application No. 2008-234270, filed on Sep. 12, 2008, the disclosures of which Applications are incorporated by reference herein.

TECHNICAL FIELD

The present invention relates to a charged particle beam device for inspecting a substrate on which a circuit pattern is formed, by using a charged particle beam. The substrate as an inspection sample is such as a semiconductor substrate for a semiconductor device or a deflection array substrate for a liquid crystal display.

BACKGROUND ART

In a manufacturing process for a substrate with a circuit pattern for a semiconductor device or a liquid crystal display, a defect such as a break, a short circuit, a flaw, or a foreign material affects the performances of the semiconductor device or the liquid crystal display manufactured from the substrate. For this reason, it is important to early detect such a defect. Along with finer circuit patterns, the inspection device, which uses an electron beam and to which the technique of an electron microscope is applied, has been put into practical use, as well as an optical inspection device using reflected light.

Defect detection with the inspection device using such a charged particle beam is performed by capturing images of a region with a repetitive pattern and an adjacent region thereof and comparing the images with each other. Namely, the defect detection is performed based on knowledge that the above circuit pattern has a feature repeating the same pattern. Alternatively, there is used a defect detecting method of storing an image with a defect-free pattern in a device as a reference image and comparing an image to be detected with the reference image. In such a defect detection, pixel(s) different in signal intensity such as brightness are extracted from the captured image by the pixel. A pixel in which signal intensity exceeds a predetermined threshold is taken as a defect candidate and the representative coordinates thereof is obtained. The reason the image is taken as a defect candidate is that noises are superimposed on the image itself due to various reasons and can be detected as a defect. An operator visually views an image having a detect candidate to determine whether the image is a true defect.

As described above, in the defect detection, images to be compared with each other since are subjected to a computing process, an inspection speed of the inspection device is basically rate-determined by a speed at which an image is captured. However, an area where the inspection device using the charged particle beam can image at one time is very small compared with an area of a substrate to be inspected, so that various methods for reducing an inspection time or improving an inspection speed without decreasing inspection accuracy are attempted.

As an example, there has been known a sampling method which reduces the number of scanning stripes for capturing an image in an image pickup process (hereinafter referred to as a swath sampling). For example, Documents 1 or 2, or Non-Patent Document 2 listed below discloses an inspection device with a function for automatically setting the number of scanning stripes to be set in a chip according to the setting value of a sampling ratio by setting a sampling ratio in setting an inspection region. According to the swath sampling, an imaging area on the substrate to be inspected although is reduced in comparison with a general inspection method, provided the imaging area is sampled by a statistically meaningful method, a problem in manufacture of the substrate can be analyzed by analyzing the distribution of the detected defect candidate or the defect candidate in detail.

Patent Document 3 and Non-Patent Document 1 listed below disclose a reference image averaging (RIA) technique in which, since the swath sampling has a relationship of trade-off between a signal-to-noise ration (S/N) and an image capturing speed, a defect determination method is devised to realize a high-speed inspection. However, a more improved device is demanded to detect an image at a high-speed.

PRIOR ART DOCUMENTS

Patent Document

Patent Document 1: Japanese Patent Application Laid-Open No. 2000-161932
Patent Document 2: Japanese Patent Application Laid-Open No. 2002-026093
Patent Document 3: Japanese Patent Application Laid-Open No. 2005-274172
Non-Patent Document 1: T. Hiroi et al, "Robust Defect Detection System Using Double Reference Image Averaging for High Throughput SEM Inspection Tool," 2006 IEEE/SEMI Advanced Semiconductor Manufacturing Conference, pp. 347-352.
Non-Patent Document 2: M. Ikota et al, "In-line e-beam inspection with optimized sampling and newly developed ADC," Proceedings of SPIE Vol. 5041 (2003), pp. 50-60.

SUMMARY OF INVENTION

Technical Problem

In the swath sampling, it is known that up to 10% sampling is a statistically meaningful sampling ratio, from evaluation experiment results disclosed in Non-Patent Document 2. This corresponds to a speed increase of 10 times. Furthermore, provided the defect determination method described in Non-Patent Document 2 is combined with the up to 10% sampling described above, it is possible to realize a speed increase of approximately 20 times.

A typical user needs an inspection in which 70% (effective area) of a 300 mm diameter wafer can be inspected by a 35-nm-pixel 200 Mpps clock in one hour. Under this condition, if any speed increasing method is not used, the inspection requires approximately 80 hours. For this reason, a speed increase of approximately 20 times that can be achieved by a conventional swath sampling is not enough, so that a further speed-increase of approximately 4 times to 10 times is required.

An object of the present invention is to provide a charged particle beam device and a substrate inspection device using the charged particle beam capable of more quickly extracting a defect candidate than ever before.

Solution to Problem

The above object can be achieved by an inspection device with a function of setting a predetermined inspection stripe in a sample to be inspected, the sample having plural regions where predetermined patterns are formed respectively, capturing plural partial region-images in the inspection stripe, and executing an inspection using the captured partial region-images. Put another way more simply, an inspection skipped region where an image is not captured, is set in the area of the inspection stripe. The inspection device according to the present invention has a function of sampling plural partial inspection regions from the sample to capture the partial inspection images while moving a sample-stage on which the above sample to be inspected is placed. The irradiation in the inspection stripe with a primary charged particle beam is performed by moving the stage and scanning sequentially the partial inspection regions with the charged particle beam in a direction intersecting with a sample stage-movement direction. Accordingly, the above sampling function is realized by executing a beam scanning deflection control in accordance with the velocity of sample stage-movement so that only the partial inspection region are sequentially irradiated with the primary charged particle beam.

This allows an inspection to be executed at a higher speed than ever before by performing an inspection by sampling only the partial inspection regions interesting an operator, i.e., region of interest (ROI) (hereinafter referred to as "ROI inspection") or by a simple sampling. A typical ROI region includes, for example, a corner portion and an edge portion of a memory mat formed in a semiconductor device or all the pattern portions excluding non-pattern portion in a case where a pattern density is low.

In the embodiment of the present invention, in order to increase the inspection speed, it is desirable to move the stage at a speed higher than an image capturing velocity with a charged particle column for executing the beam scanning deflection control. In this case, an image capturing timing since is asynchronous with the velocity of the sample stage movement, a beam deflecting-back deflection control is also used to avoid displacement in beam irradiation positions resulting therefrom.

The inspection device of the present invention may have a management console for displaying a screen for setting the dimension of the above ROI region and a repetitive pitch. Furthermore, the inspection device may compute the above mentioned stage movement velocity and the amount of deflection control of the primary charged particle beam based on control parameters such as values for setting the dimension of the ROI region and the repetitive pitch. The inspection device captures images using the computed values, executes a trial inspection by comparing the images with each other, and sets an inspection recipe by determining whether an inspection condition is accepted.

Advantages of the Invention

According to the present invention, the charged particle beam device capable of extracting a defect candidate at a higher speed than ever before can be realized.

DESCRIPTION OF EMBODIMENTS

The embodiment of the present invention is described below with reference to drawings.

Embodiment 1

Figure 1:
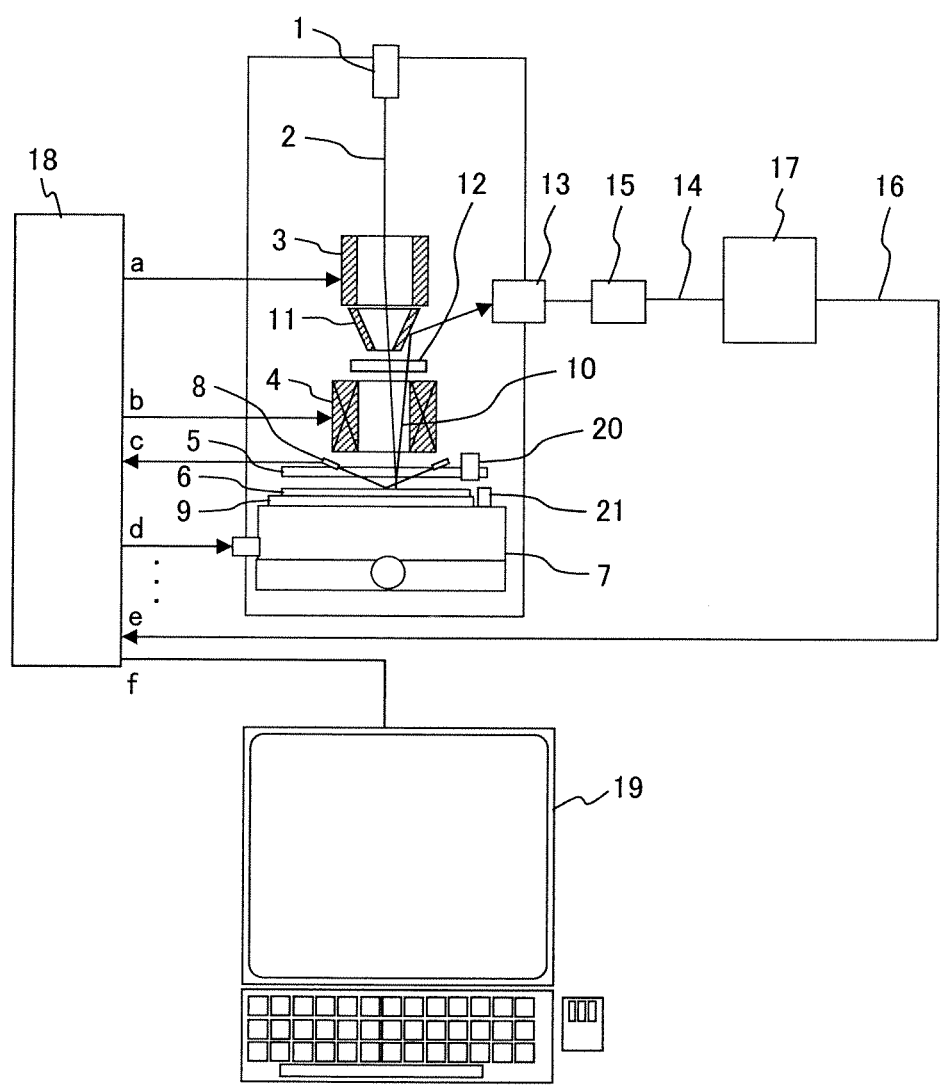
FIG. 1 is a vertical section showing the configuration of a substrate inspection device.

FIG. 1 is a vertical section showing a configuration of an inspection device according to the present embodiment. The inspection device of the present embodiment is the one to which a scanning electron microscope is applied. The principal units are contained in a vacuum container. This is because a substrate such as a semiconductor wafer is irradiated with a primary charged particle beam. The inspection device of the present embodiment includes a charged particle column comprising an electron source 1 for irradiating a wafer 6 placed on a sample table 9 with a primary charged particle beam 2, a detector 13 for detecting a secondary charged particle 10 such as secondary electrons generated on the wafer or a reflection electrons from the wafer to output a signal as a secondary charged particle signal. The inspection device further includes the followings: an X-Y stage 7 for moving the sample table 9 in an X-Y plane; a defect determination section 17 for imaging the secondary charged particle signal output from the column, comparing the image obtained from the secondary charged particle signal with a reference image and extracting a pixel or pixels having a difference in the amount of signals as a result of a comparison therebetween, namely extracting the pixel or pixels as a defect candidate; and a general control section 18 for generally controlling the charged particle column, the X-Y stage 7, and the defect determination section 17. The X-Y stage 7 and the sample table 9 are held in a vacuum sample chamber.

Since the primary charged particle beam 2 is greatly narrowed by an object lens 4 to converge the energy of the primary charged particle beam 2 onto the wafer 6, the diameter of the primary charged particle beam 2 is significantly small on the wafer 6. The primary charged particle beam 2 is deflected by a deflector 3 in the predetermined region on the wafer 6 to scan the wafer 6. The position of movement by scanning is synchronized with the detection timing of a secondary signal 10 to form a two dimensional image.

A circuit pattern is formed on the surface of the wafer 6. However the wafer 6 since is made of various materials, the wafer 6 may produce a charging phenomenon in which an electric charge is accumulated on the wafer by the irradiation of the primary charged particle beam 2 on the wafer 6. The charging phenomenon since changes the brightness of an image or deflects the orbit of incident primary charged particle beam 2, a charging control electrode 5 is provided in front of the wafer 6 to control field strength.

Before the wafer 6 is inspected, a reference sample 21 is irradiated with the primary charged particle beam 2 to form an image, then calibrations for the coordinates of the primary charged particle beam-irradiating position and a focal point are executed respectively. As described above, the diameter of the primary charged particle beam 2 is significantly small, the scanning width of the deflector 3 is much smaller than the size of the wafer 6 and the image formed by the primary charged particle beam 2 is vary small. For this reason, the wafer 6 is placed on the X-Y stage 7 before the inspection, an coordinate calibration use alignment mark on the wafer 6 is detected from an image with a comparatively low magnification rate using an optical microscope 20, the X-Y stage 7 is moved to position the alignment mark under the primary charged particle beam 2, thereby calibration of the coordinates is executed.

A calibration for focus is performed by the followings: measuring the height of the reference sample 21 with a Z-sensor 8 for measuring the height of the wafer 6, next measuring the height of the alignment mark on the wafer, and adjusting excitation strength of the object lens 4 so that a focus range of the primary charged particle beam 2 narrowed by the object lens 4 includes the alignment mark.

A large number of the secondary signals 10 are caused to strike on a reflection board 11 with a secondary signal reflector 12 to detect as many of the secondary signals 10 generated on the wafer 6 as possible. Second secondary electrons generated with the reflection board 11 are detected with the detector 13.

The general control section 18 controls the above-mentioned operations for configuration as to the coordinates and focus. The general control section 18 sends a control signal (a) to the deflector 3 and sends a control signal (b) of the excitation strength to the object lens 4. The general control section 18 receives a measurement (c) of height of the wafer 6 sent from the Z-sensor 8 and sends the X-Y stage 7 a control signal (d) to control the X-Y stage 7.

The signal detected by the detector 13 is converted into a digital signal 14 by an AD converter 15.

The defect determination section 17 generates an image from the digital signal 14, compares the image with a reference image, extracts a plurality of pixels having a difference with respect to the reference image in brightness as defect candidates, and sends the general control section 18 a defect information signal (e) including the coordinates on the wafer 6 corresponding to the image signal.

The inspection device according to the present embodiment includes a console 19. The console 19 is connected to the general control section 18 to display a defect image on the screen of the console 19. The general control section 18 computes the control signal (a) for the deflector 3, the control signal (b) of the excitation strength for the object lens 4, and the control signal (d) for controlling the X-Y stage 7. The console 19 is equipped with a key board for inputting the above inspection conditions and a pointing device such as a mouse. A device user operates the key board and the pointing device to input the inspection conditions.

Figure 2A:
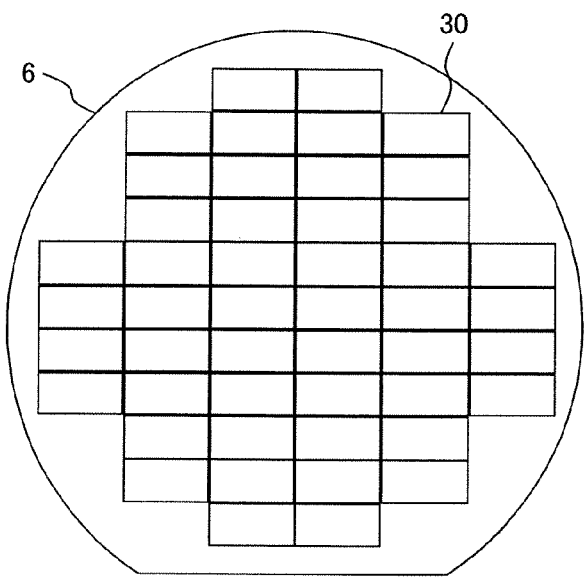
FIGS. 2A to 2D are plan views of a wafer.
Figure 2B:
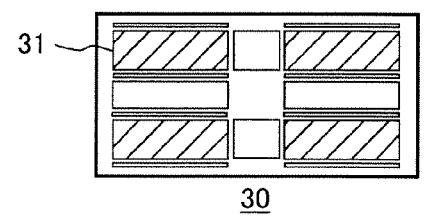
Figure 2C:
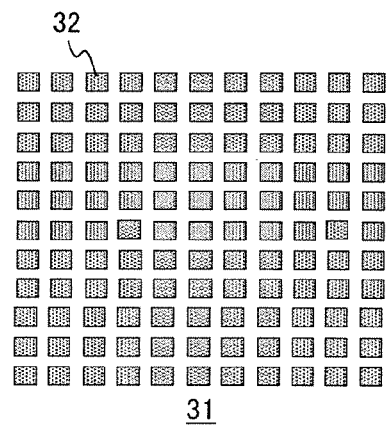
Figure 2D:
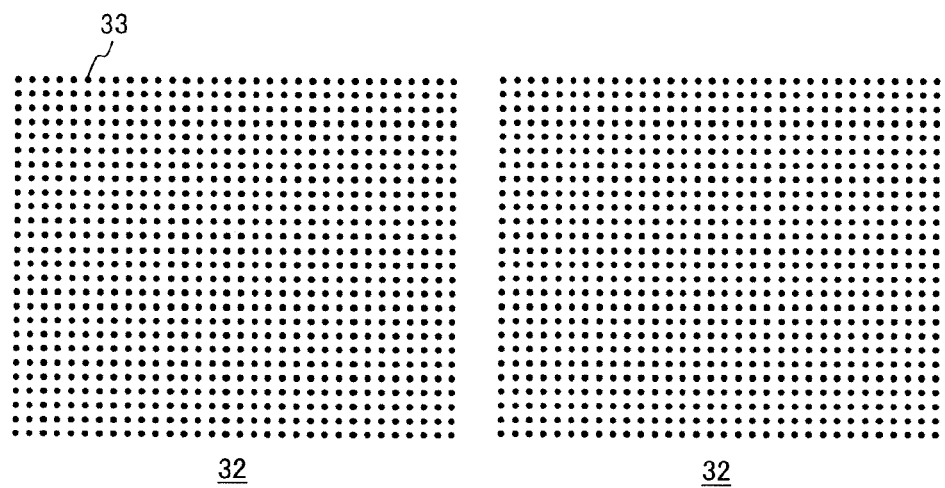

FIGS. 2A to 2D are plan views of the wafer 6 to be inspected. As shown in FIG. 2A, the semiconductor wafer 6 is a disk-shaped silicon substrate with a diameter of 200 mm to 300 mm and a thickness of approximately 1 mm. A plurality of dices 30 to be a semiconductor chip is formed from the wafer. The size of the wafer 6 has been already standardized, so that the number of the dice 30 formed on the single wafer 6 is determined depending on the size of the die 30. As shown in FIG. 2B, the single die 30 includes a plurality of memory mat groups 31 and memory-mat peripheral circuit group excluding the memory mat groups 31. For a general memory device, a pattern layout of the die 30 is configured by four memory mat groups 31. As shown in FIG. 2C, each single memory mat group 31 is formed of a plurality of memory mats 32. For a general memory device, the memory mat group 31 is formed of approximately 100×100 memory mats 32. As shown in FIG. 2D, the memory mat 32 is comprised of a plurality of memory cells 33 with repeatability in the two-dimensional direction. Several million memory cells 33 form the single memory mat 32. Each of the memory cells 33 can be a hole (a contact hole or a via hole) formed in the insulation film or the hole can be plugged with a wiring material (referred to as a plug). A determination as to what state the wafer is inspected depends on a condition that the wafer is inspected under what production process of a semiconductor device.

Figure 3A:
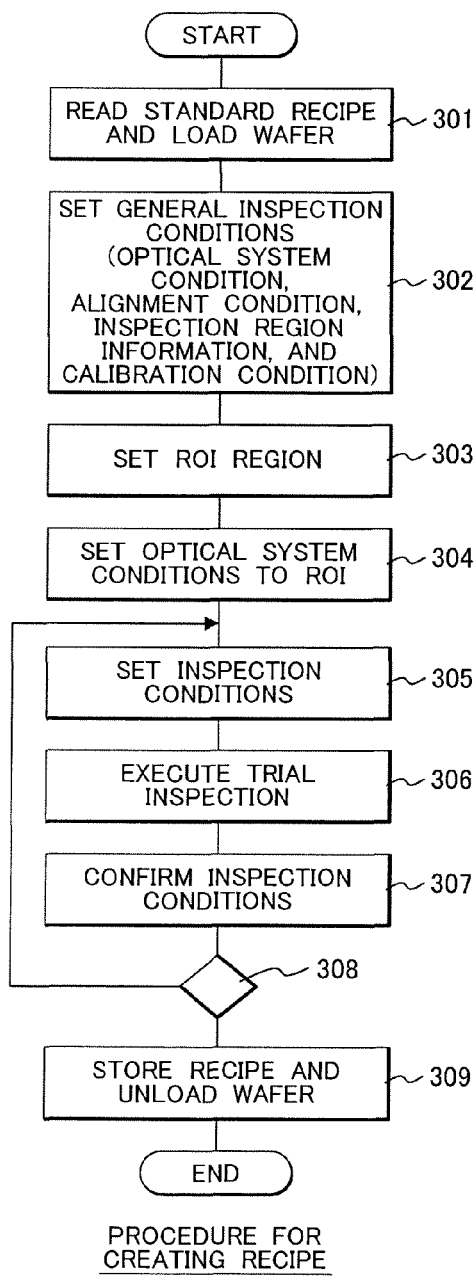
FIGS. 3A and 3B are flowcharts showing the procedure for creating a recipe and the procedure for inspection.
Figure 3B:
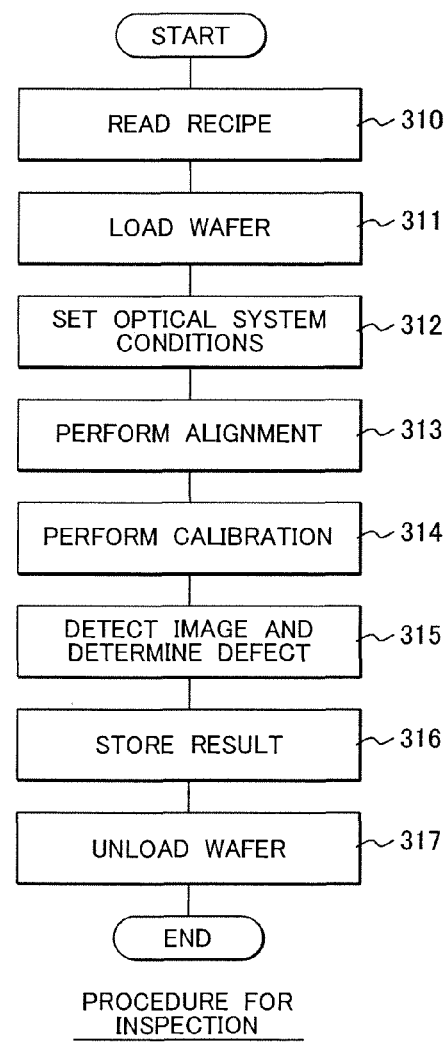

Prior to inspection, a recipe for determining inspection conditions and an inspection procedure is formed. FIGS. 3A and 3B are flow charts showing the procedure for creating a recipe and the inspection procedure conducted along the set recipe respectively. In FIG. 3A, the general control section 18 reads a previously created and stored standard recipe. In step 301, the wafer 6 to be inspected is loaded into the inspection device. The general control section 18 starts a process for reading the standard recipe and loading the wafer 6 with instructions input by the operator using the console 19, namely the instructions act as a trigger for starting the process. The loaded wafer 6 is placed on the sample table 9. In step 302, the general control section 18 sets the followings: optical conditions such as the voltage applied to the electron source 1, the excitation strength of the object lens 4, the voltage applied to the charging control electrode 5, and the current applied to the deflector 3 based on the read standard receipt; the general control section 18 sets alignment conditions for obtaining correction between the coordinates with reference to the alignment mark of the wafer 6 and the X-Y stage 7 of the inspection device based on the image of the reference sample 21; the general control section 18 sets inspection region information indicating a region to be inspected on the wafer 6, and sets calibration conditions for registering both of coordinates used for capturing the image for adjusting the amount of light of the image and the initial gain of the detector 13.

The corner portion of the memory mat 32 shown in FIG. 2D is liable to cause a defect on the production process because the corner portion is a boundary between a region where a large number of the memory cells 33 with repeatability exists and a region where the memory cell 33 with repeatability does not exist. Since a material is different between the regions where the memory cell 33 with repeatability exists and does not exist, if a defect inspection is performed by comparing the image at the corner portion of the memory mat 32 captured without changing the electro-optical condition with the image at the region excluding the corner portion, the memory cell that is not actually defective may be extracted as a defect by mistake because pixels are different in brightness between the corner portion and the region excluding the corner portion.

Therefore, in step 303, in order to inspect the corner portion of the memory mat 32 as shown in FIG. 2D, the corner portion is selected by displaying the pattern layout of the wafer 6 on the screen of the console 19 and surrounding the region of corner portion of the memory mat 32 by a square on a GUI screen. In step 304, the optical conditions for imaging the corner are set.

Actually, prior to the selection of corner portion of the memory mat, setting for an arrangement of the inspection stripe in any region of the die is executed. In setting of the arrangement of the inspection stripe, the inspection stripe is set so that the desired corner portion of the memory mat is included, thereafter, the corner portion is selected in step 303.

In step 305, the inspection conditions are set to perform a trial inspection for confirming whether the set optical conditions are correct. In step 306, the trial inspection described later is executed. In step 307, the operator determines the result of the trial inspection and confirms whether the inspection condition is correct. In step 308, if the operator determines that any of the inspection conditions needs correcting, it is corrected in step 305. If the operator determines that the inspection conditions do not need correcting, the recipe is stored, the wafer 6 is unloaded and the formation of the recipe is finished in step 309.

FIG. 3B shows procedures for the inspection. In step 310, the recipe stored in FIG. 3A is read. In step 311, the wafer 6 to be inspected is loaded into the inspection device. By using the console 19, and according to the specification of the wafer 6, the operator sets the optical conditions to the general control section 18 by selecting or specifying any suitable stripe to be actually used from among inspection stripes capable of including the corner portion of the memory mat, as well as a pixel dimension, and the number of times of line addition (step 312); the operator performs coordinate-alignment between the semiconductor wafer 6 and the X-Y stage 7 (step 313), and performs calibration for adjusting the amount of light of the image (step 314).

In step 315, the defect inspection is started. The following series of processes for the defect inspection is repeated until the inspection of a predetermined die is finished: capturing an image in the selected inspection region, comparing the captured image with the reference image to extract a difference therebetween and determining the difference as a defect candidate (step 315); and storing the captured image with the difference, the reference image and representative coordinates of the defect candidate in a storage device (step 316). In step 317, when the inspection of a final die placed on the wafer 6 is finished, the wafer 6 is unloaded.

Figure 4:
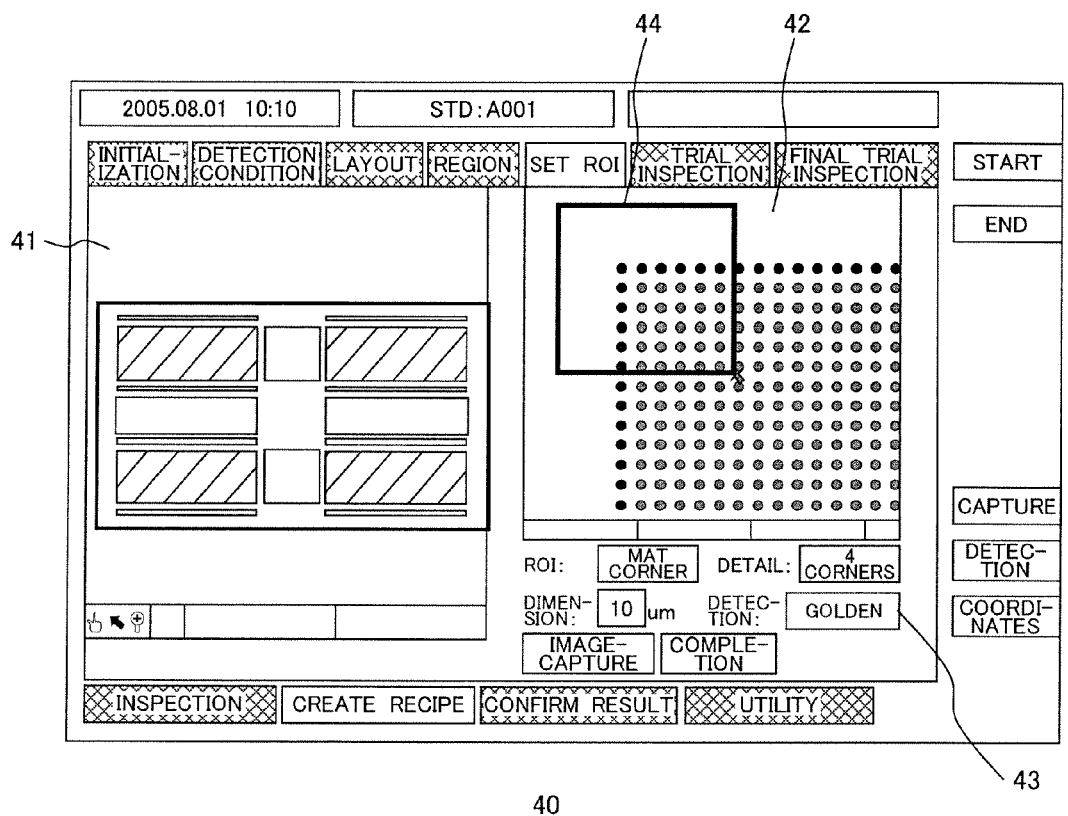
FIG. 4 shows an example of a screen displayed on the screen of a console.

FIG. 4 shows an example of an inspection region setting screen 40 displayed on the screen of the console 19 when executing steps 303 and 304 of the flow chart shown in FIG. 3A. A general schematic diagram of the die 30 shown in FIG. 2B is displayed in a map display region 41 on the left of the screen 40 in FIG. 4. The image of the memory mat 32 shown in FIG. 2D is displayed in an image display region 42 on the right of the screen 40 in FIG. 4. The image on the coordinates specified in the map display region 41 is displayed in the image display region 42. The screen 40 also displays an ROI condition setting section 43 for confirming and changing the ROI conditions. When selecting any one of objects to be inspected in the ROI region (namely, the objects are a mat corner, simple sampling, a combination of the mat corner with the simple sampling, and any pattern portion to be selected from all pattern portions in the case that densities of all pattern portions are low), for example, selecting the mat corner, detailed specification is needed about mat corner portion to be inspected (for example, how many corner potions to be inspected among four corner portions or what percentage of memory mats among the corners of a plurality of memory mats to be inspected). Furthermore, when selecting the mat corner, the specification is needed about what dimension to be inspected including the mat corner. The operator inputs various conditions into the ROI condition setting section 43 to set an inspection region.

The corner portion of the memory mat 32 shown in FIG. 2D since has a high frequency as to defect, the inspection device of the present embodiment has a function by which only a corner portion can be set as the inspection region. A rectangular region 44 is specified on the image display region 42 in FIG. 4 to set the corner portion of the memory mat 32 as the region to be inspected.

In a typical image comparison inspection, adjacent similar patterns are compared with one another to extract a difference. However, in the inspection of a memory-mat portion, adjacent similar patterns since do not exist, a comparison inspection is performed by previously producing a reference defect-free image for the memory-mat portion (the defect-free image is called as a golden image) and comparing the golden image with the captured image of the real mat portion to extract a difference therebetween.

The inspection region setting screen 40 shown in FIG. 4 shows an example in which a "mat corner" is set as ROI, "four corners" as detail, "10 μm" as dimension, and "golden" as defect detection in the ROI condition setting section 43. This means that four corner portions of the memory mat 32 shown in FIG. 2D are selected as the ROI region, all the four corners of the memory mat 32 are inspected, an image capture-dimension is 10 μm, and the golden image is produced. When the operator clicks an "IMAGE-CAPTURE" button, it is possible to capture images on a full-inspection stripe or a partial region including at least the ROI region. A computing device included in the console 19 produces the golden image by clipping partial images of the ROI region from the captured images, performing registration of the partial images and then performing averaging of them. The operator confirms the golden image in the image display region 42 and pushes a "COMPLETION" button to store the golden image in the recipe. The golden image may be produced by the defect determination section 17.

Figure 5:
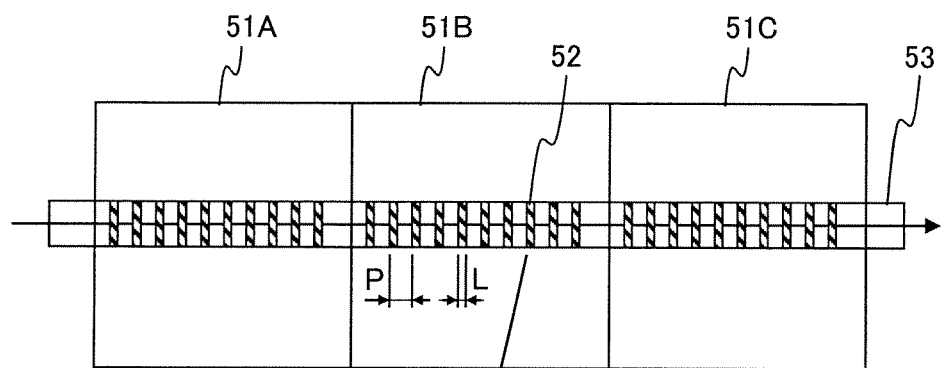
FIG. 5 are enlarged views of a plurality of dice shown in FIG. 2A.
Figure 5:
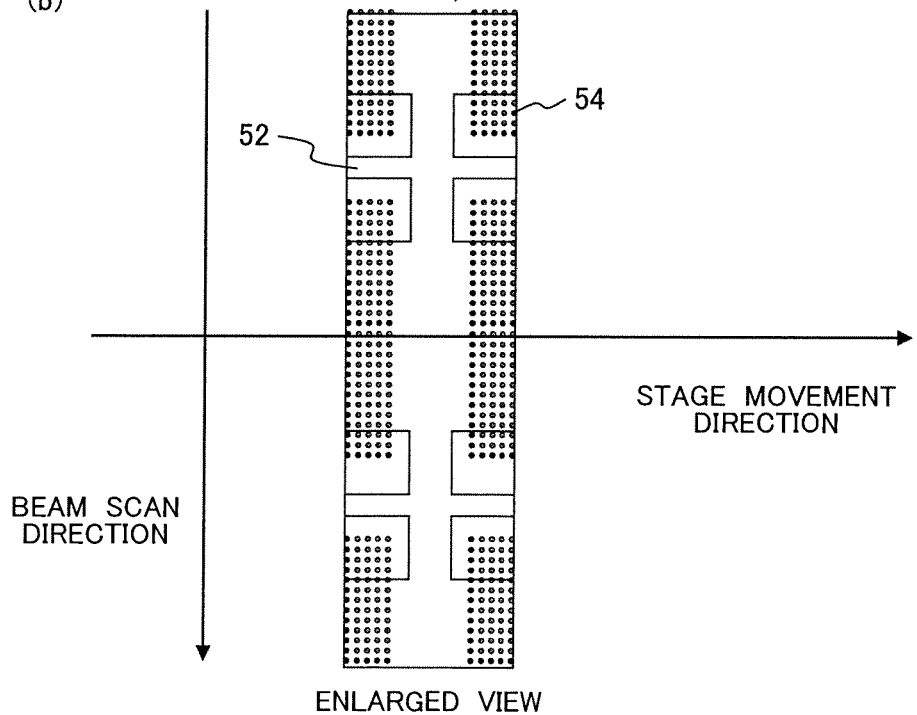

Contents of the trial inspection shown in step 306 in FIG. 3A are described below with reference to FIGS. 5 to 7. (a) of FIG. 5 is an enlarged view of the plurality of dice 30 shown in FIG. 2A. (b) of FIG. 5 is a diagram further enlarging a part of the inspection stripe set in a certain die. In (a) of FIG. 5, reference numerals 51A, 51B, and 51C denote the plurality of dice 30 arranged adjacent to each other and a reference numeral 52 represents the ROI scan region set in an inspection stripe 53. In the present embodiment, the ROI scan region 52 is set in the inspection stripe 53 with a width of L and a pitch of P between the adjacent ROI scan regions. An arrow passing through the center of the inspection stripe 53 shows the center in the y-direction of scan of the primary charged particle beam and means the direction in which the sample stage 7 is moved.

In the trial inspection in step 306, the inspection device scans the ROI scan region 52 with the primary charged particle beam in a direction orthogonal to a direction of the X-Y stage 7 movement while moving the X-Y stage 7 in the direction indicated by the arrow along the plurality of dice 51A, 51B, and 51C to capture images in the partial region including the corner portion in the ROI scan region 52.

A detail configuration in the ROI scan region 52 is described below with reference to (b) of FIG. 5. As shown in (b) of FIG. 5, in the present embodiment, the inspection stripe 53 is set so that six edges of the memory mat are included in the ROI scan region 52. For this reason, two sets of four corners formed at the memory mat-edges opposing each other are included in the single ROI scan region 52. In (b) of FIG. 5, an ROI capturing region 54 corresponding to the rectangular region 44 in FIG. 4 is set in the eight memory mat corners in the ROI scan region 52.

The ROI scan region 52 and the ROI capturing region 54 are set by providing information of inspection stripe arrangement on the die to be inspected and information of the ROI set on the inspection region setting screen 40 in FIG. 4 to all the dice to be inspected on the wafer 6. The computing process for such setting is executed by the general control section 18. The width and length of the memory mat 32 are substantially constant in all the memory mats formed in the wafer and the layout thereof is previously specified. For this reason, the general control section 18 can obtain information about coordinates of each ROI scan region 52 arranged on the inspection stripe 53 from information about the width L and the P of the ROI scan region 52, thereby can controlling beginning timing and end timing at which each ROI scan region 52 is irradiated with the primary charged particle beam.

The captured image data in each ROI scan region 52 are transferred to the defect determination section 17. The defect determination section 17 extracts an image of the ROI capturing region 54 using information about the layout of the memory mat and information about each ROI scan region 52 obtained by the general control section 18, compares the captured image with the golden image described later to execute the defect inspection.

The golden image being the reference image for a comparison inspection is produced by performing averaging of plural ROI capturing regions 54. The defect determination section 17 compares the golden image with the captured image in the plurality of the ROI capturing regions 54. If there is a difference in brightness therebetween for each pixel, the pixel is extracted to produce an image as defect candidate. The image as a defect candidate and the coordinates of the defect candidate are stored in the defect determination section 17 as defect information and can be displayed on the screen of the console 19.

Next, control of moving the stage in the ROI inspection according to the present embodiment is described below. In a conventional comparison inspection, in order to capture the image on the inspection stripe 53 shown in (a) of FIG. 5, the primary charged particle beam 2 is one-dimensionally scanned within a width of the inspection stripe 53 in the direction substantially perpendicular to the direction indicated by the arrow in (a) of FIG. 5 while continuously moving the X-Y stage 7 in the direction indicated by the arrow. On the other hand, the inspection device according to the present embodiment has only to scan only a part of the inspection stripe 53, i.e., only the ROI scan region 52 including the ROI capturing region 54, so that the movement velocity of the X-Y stage 7 can be made quicker correspondingly, than that in the conventional comparison inspection.

The reason the movement velocity of the X-Y stage 7 can be made quicker in the present embodiment is described below with reference to FIG. 6. (a) and (d) in FIG. 6 are schematic diagrams showing time distances on the length L of the ROI scan region 52 and on the arrangement pitch P in a predetermined stage movement velocity. (b) and (e) in FIG. 6 are schematic diagrams showing how the ROI scan regions 52 are arranged on the inspection stripe 53 in the actual wafer. (c) and (f) of FIG. 6 are schematic diagrams showing a positional relationship among scanning lines in a visual field region with a size M. (a), (b) and (c) of FIG. 6 correspond to a case where a stage movement velocity V0 is equal to a conventional one. (d), (e) and (f) of FIG. 6 correspond to a case where a stage movement velocity is set to Vs faster than the stage movement velocity V0. As shown in (b) of FIG. 6, assume that the plurality of the ROI scan regions 52 are arranged on the inspection stripe 53 with a pitch P and the ROI scan region 52 is formed of n scanning lines of the primary charged particle beams arranged in a stage movement direction. For the sake of simplicity of description, the length of each ROI scan region 52 is taken as L, the width of the inspection stripe 53 (the width is a measurement in the short-side direction perpendicular to the long-side direction of the inspection stripe) is taken as I, and the center of the inspection stripe (the dotted line in (b) of FIG. 6 is taken as the center of scanning deflection of the primary charged particle beam.

In the above case, when capturing all the images on the inspection stripe 53 with the primary charged particle beam scanning, the stage has to move only by the distance of one scanning line in the stage movement direction (the distance is corresponding to one pixel) during the time required for scanning of per one scanning line. The time required for scanning of the primary charged particle beam per one scanning line is equal to 1/f with the deflection frequency of the scanning deflector as f. Usually, the detector 13 of the inspection device outputs image data for one scanning line per the above time of 1/f, so that 1/f is referred to as one-line image capturing time. A normal stage movement velocity V0 refers to the velocity at which the sample stage can move by one pixel size during the time corresponding to the one-line image capturing time. In the present embodiment, the V0 may be represented by the stage movement velocity synchronized with the beam scanning.

Figure 6:
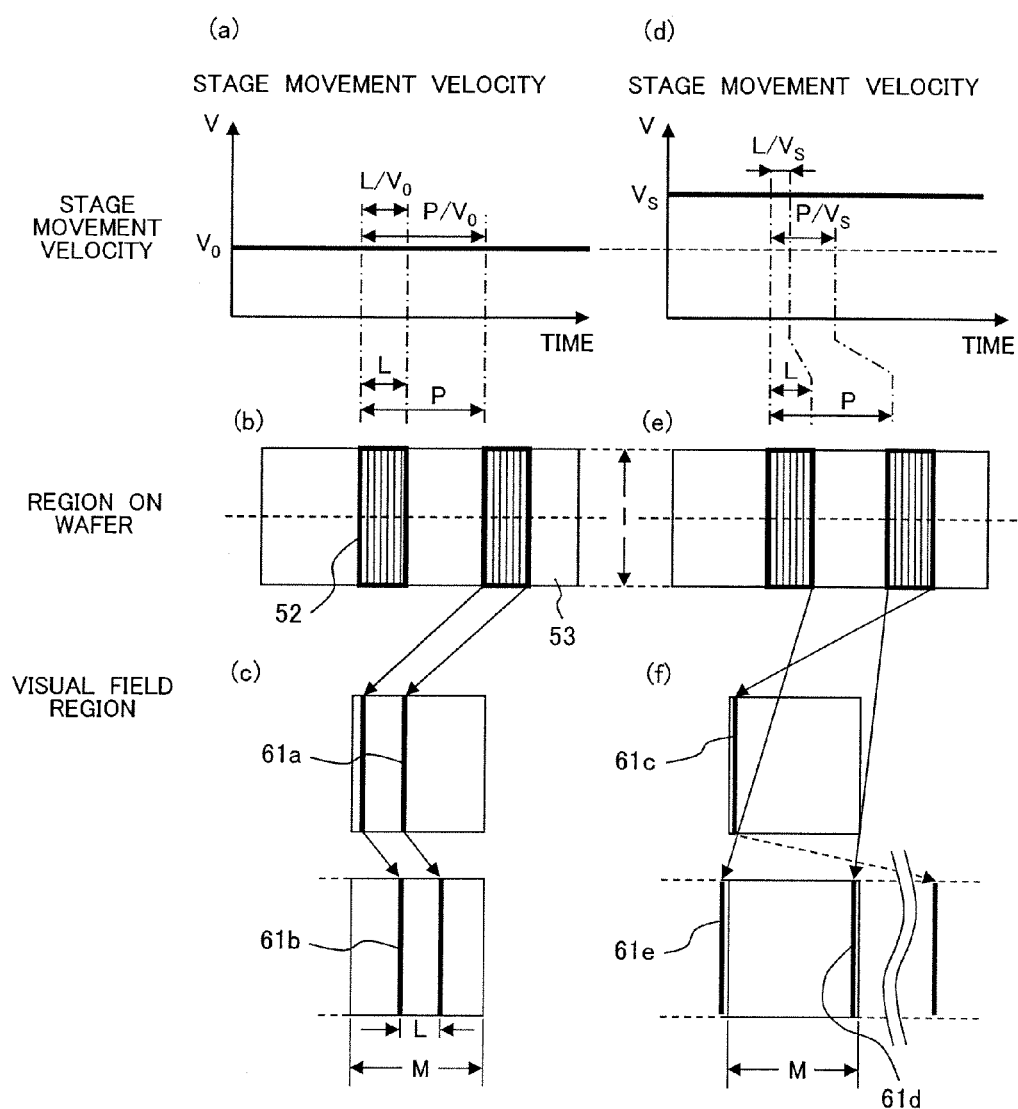
FIG. 6 is graphs showing a change in stage velocity with time.

As shown in (b) of FIG. 6, assuming that that plural ROI scan regions 52 are arranged on the inspection stripe 53 with a pitch P and the stage is continuously moved at the velocity V0, as shown in (c) of FIG. 6, the first scanning line 61a and an n-th scanning line 61b arranged in the ROI scan regions 52 move only by the length corresponding to n pixels, i.e., an actual distance L on the wafer within the range of the visual field region M. This is because, as described above, the stage movement velocity is synchronized with the beam scanning speed.

On the other hand, assuming that the stage is moved at a velocity Vs faster than the stage movement velocity V0, the irradiation position of the primary charged particle beam is moved to the adjacent scanning line before the scanning of one line is finished, thereby failing to scan an imaged position on the actual wafer. More specifically, if the stage movement velocity Vs is faster than the image capturing speed, it is impossible to capture the images on the full-inspection stripe 53. However, as shown in (e) of FIG. 6, even at the stage movement velocity Vs, when only an image in the intermittently arranged ROI scan region 52 has to be captured on the inspection stripe 53, as shown in (f) of FIG. 6, if an image-capture is started just when a first scanning line 61c enters the visual field region with a size M (namely, at the point when the first scanning line 61c lies on the left side-edge of the visual field region M in (f) of FIG. 6) and the final pixel of an n-th scanning line 61d is completed to be captured while the n-th scanning line 61d exists in the visual field region M, images can be captured in the ROI scan region 52 without failure, by the following conditions.

The size M of the visual field region is normally maximized within the range of maximum value of visual field determined by the performance of an electro-optical system. The electro-optical system has a visual field with a certain size and images substantially equivalent in the influence of aberration and distortion can be captured in the visual field. The maximum value of the visual field is determined by the performance of an electro-optical system such as the deflection distance of a scanning deflector or the degree of aberration of curvature of field. The greater the visual field region to be set, the greater the region of a sample which can be imaged at one time, thereby enabling a high-speed inspection also in the ROI inspection.

To be more exact, if the primary charged particle beam irradiation is started at a head pixel in the first scanning line 61c at the instant when an actual wafer's position to be the head pixel of the first scanning line 61c comes into the visual field region M, and if the primary charged particle beam irradiation is finished at the instant when an actual wafer's position to be the final pixel of the n-th scanning line 61d comes out of the visual field region M, the entire ROI scan region 52 can be imaged without failing to capture the images.

Reference numeral 61e denotes a first scanning line in the next ROI scan region 52. Hereinafter, the beam is sequentially scanned to the set plurality of ROI scan regions.

In addition, in this case, the stage movement velocity Vs since is asynchronous with the scanning deflection frequency of the beam, the beam irradiation position in the ROI scan region 52 is gradually displaced from the position on the scanning line to be originally irradiated with the beam with respect to the stage movement direction if nothing is done. The inspection device of the present embodiment cancels the displacement due to asynchronism between the beam scanning deflection frequency and the stage movement velocity by deflecting back the irradiation position of the primary charged particle beam to the same direction as the stage movement direction by a deflecting-back deflection. This control is realized by the general control section 18 causing the scanning deflector 3 to perform the deflecting-back deflection to cancel the above displacement due to asynchronism.

The aforementioned displacement due to asynchronism increases along with advancement in the repetition of scanning from the first scanning line to the n-th scanning line, so that the deflection distance of deflecting-back deflection of the primary charged particle beam 2 (the beam deflection angle of the scanning deflector 3) increases. The greater the beam deflection angle of the scanning deflector, the more advantageously the stage movement velocity is increased.

However, the stage movement velocity Vs cannot be limitlessly increased but is restricted by the ratio of the size M of the visual field region to the length L of the ROI scan region 52 (substantially, the area of the ROI scan region). A mathematical formula 1 given below indicates the above constraint condition and shows that, if an imaging region with a length L is set in the visual field region with a size M, the stage movement velocity should be smaller than the right side value of the mathematical formula 1 to image throughout the imaging region.

$$Vs \leq \{(L+M)/L\}V0 \qquad \text{[mathematical formula 1]}$$

On the other hand, the upper limit of the stage movement velocity is restricted also by the length L of the ROI scan region 52 and the arrangement pitch P in the stage movement direction in the ROI scan region 52. The following mathematical formula 2 shows the constraint condition.

$$Vs \leq (P/L)V0 \qquad \text{[mathematical formula 2]}$$

If a scan skip region is considered to be provided between the ROI scan regions from which images are captured, the mathematical formulas 1 and 2 are understandable. The greater the length of the skip region, the faster the stage movement velocity can be made. On the other hand, the greater the width of the ROI scan region, the slower the stage movement velocity needs to be made. For this reason, the stage movement velocity is set according to the ratio of the width of the scan region to the width of the skip region. As shown in (b) and (e) of FIG. 6, if the length of the ROI scan region 52 is L and the arrangement pitch in the stage movement direction is P, the size of the scan skip region is equal to difference between P and L, namely (P−L). If a scanning skip distance is taken as S, S is represented by S=P−L, and S=P−L can be rewritten as P=S+L. Substituting P=S+L for the mathematical formula 2 gives the following formula:

$$Vs \leq \{(L+S)/L\}V0 \qquad \text{[mathematical formula 3]}$$

Apparently, the mathematical formula 3 is equal to the mathematical formula 1. More specifically, the mathematical formulas 1 and 2 show that the maximum value of the scan skip region is M−L, i.e., the condition under which one ROI scan region can be set in the visual field with a size M (the condition under which the beginning edge and ending edge scanning lines in the ROI scan region can exist in the same visual field M) is the upper limit of the scan skip region; and the increase of the number of the ROI scan regions and the area thereof in the visual field M requires that the stage movement velocity should be reduced by just that much.

The mathematical formula 3 can be changed into the following formula:

$$Vs - V0 = \Delta V = (S/L)V0 \qquad \text{[mathematical formula 4]}$$

This formula shows that the increment of the stage movement velocity from V0 in the ROI inspection is determined according to the ratio of the length of the skip region to that of the ROI scan region 52 or the ratio of visual field size M to the length of the ROI scan region 52.

As described above, it is possible to capture the images to be captured at a high speed by moving the scanning position of the beam 2 under the restraints of the mathematical formulas 1 and 2 according to the region where images are desired to be captured.

For example, when the width L=10 μm, the visual filed M=100 μm, and the pitch P=60 μm, V≤11×V0 or V≤6×V0 can be obtained from the mathematical formula 1. This means that, even if the stage is moved at most six times faster than the case where full images in the inspection stripe 53 are captured, the images can be captured in the ROI capturing region 54.

The above description is made on the premise that the general control section 18 executes the stage control. It is needless to say that a stage movement control means configured to dedicatedly execute the stage movement control may be separately provided.

Figure 7:
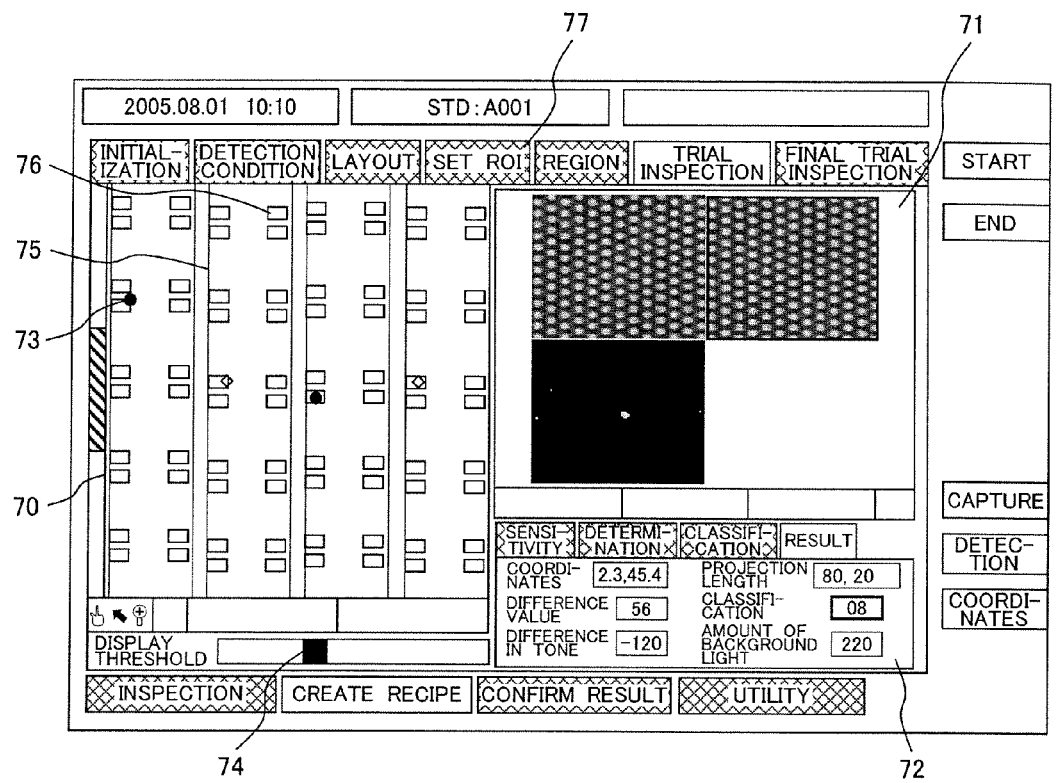
FIG. 7 shows a screen displayed at a trial inspection.

FIG. 7 shows a trial inspection execution screen which is displayed in the trial inspection in step 306. The trial inspection execution screen includes a map portion 70 on which the inspection stripe 53 is dividedly displayed, an image display portion 71 on which a defect image is displayed, and a defect information display portion 72 on which various attribute information (RDC information) such as conditions for detecting defects and characteristics of defects is displayed. In FIG. 7, four ROI scan regions 52 indicated by reference numeral 75 are displayed on the map portion 70. A rectangle 76 indicating the ROI capturing region 54 and a pointer 73 for highlighting a defect candidate are displayed in each scan region 75. Although a detailed description is omitted, the rectangle 76 indicating the ROI capturing region 54 can be edited by switching a condition setting tab into an ROI region setting tab 77. Clicking the pointer 73 displays the image and information of a defect candidate corresponding to the pointer 73 on the image display portion 71. Moving the slider of a display threshold setting tool bar 74 allows selecting the pointer 73 of a defect candidate displayed on the map portion 70. In other words, information in which a defect candidate can be selected on condition that the display threshold is lower than a certain value, is predetermined; and by moving the slider in the tool bar, only the defect candidate satisfying the conditions is displayed as itself in accordance with the threshold determined by slider.

The map portion 70 includes a mode for selecting an image display mode of the image display portion 71. There can be switchably displayed the image of the defect candidate, a part of the captured images stored in the memory, the images re-captured by moving the stage according to the mode. According to the image of the defect candidate, it is possible to confirm detailed determination of a defect therethrough. According to the part of the captured images, it is possible to determine whether another defect to be detected exists around a certain defect. According to the re-captured images, it is possible to observe whether the detected defect is a true defect in a case where the detected defect is observed under an optical condition of a high magnification or a high S/N. Switching the selection mode enables displaying the captured image itself including the defect candidate on the image display portion 71. The general control of the GUI screen is made by a computing device in the console 19.

Although not illustrated, by clicking a golden image capturing button, it is possible to re-capture the golden image based on the currently captured image, thereby allowing the image to be updated. By updating such an image or by being selectable as to the image used for averaging in producing the golden image, it is possible to produce a reference image with a fewer noise components such as a defect. After the inspection condition is set, information is stored in the recipe, the wafer is unloaded, and the production of the recipe is completed.

Figure 8:
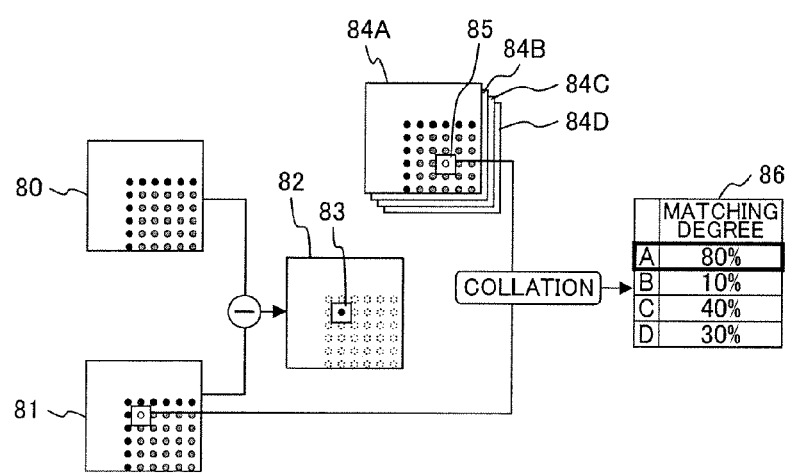
FIG. 8 is a schematic diagram describing a method of determining a defect.

FIG. 8 is a diagram describing a method of determining a defect. There are several kind of modes in defects of interest (DOI) among the defects detected by the inspection device, for example: a black-pattern white-defect mode in which a hole portion of the contact hole normally appearing black appears white because of non-conduction; a small-hole defect mode in which a black pattern appears small because the hole diameter of the contact hole is reduced; and a white-pattern white-defect mode in which a plug portion normally appearing white make a short-circuit with an adjacent plug and thereby it appears whiter than the normally appearing white. The appearance of the defect pattern is determined according to the above modes. As to a nuisance which is a noise desired not to be detected, it typically is exampled as a white bright-spot defect-mode in which a white bright spot appears in an insulation-film region due to electrical charges therein.

The defect determination section 17 compares an ROI capturing region image 81 with a golden image 80 to produce a first difference image 82 with a size of an ROI capturing region including a pixel different in brightness (whose position coordinates corresponds to the position of a defect candidate) and produces a second difference image 83 in the order of a region in size including only the vicinity of the position of a defect candidate using the difference image 82.

The defect determination section 17 uses images 84A, 84B, 84C, and 84D of various defect modes such as previously obtained black-pattern white-defect mode, small-hole defect mode, and white bright-spot defect-mode in an insulation film thereby to produce a "reference image 85 for determining a matching rate", the reference image 85 to be compared with the second difference image 83 in terms of the above various defect modes. A plurality of reference images 85 for determining a matching degree are collated with the second difference image 83 to calculate a matching rate with respect to the various defect modes. A table 86 shows calculation results of a matching rate corresponding to the defect modes A to D and also shows that the defect mode A is the highest in a matching rate.

By selecting the mode being the highest in the matching rate, it is possible to know the certain defect mode as to the detected defect. Images previously captured for reference image are exampled as follows: namely, images with a non-conductive defect mode in which the holes' resistances are the same kind (non-conduction, for example) but the values of the resistances are different from each other, or images with different defect modes (a non-conductive defect mode in which the holes' resistances of the hole are different from each other and a small hole defect mode in which the diameters of the holes are different from each other, for example)

or any one of the both different modes.

Therefore, the inspection device of the present embodiment is provided with a memory for storing image data of the above-mentioned defect modes in the defect determination section 17. According to the present embodiment, it since is possible to compare images captured to be inspected with a reference sample (reference mode) previously captured as defect mode, it can obtain information only as to the interesting defect mode as well as information such as occurrence frequency of defect in which any defect mode is not specified or information of defect-distribution, by filtering the compared image with any defect mode.

Figures 9, 10:
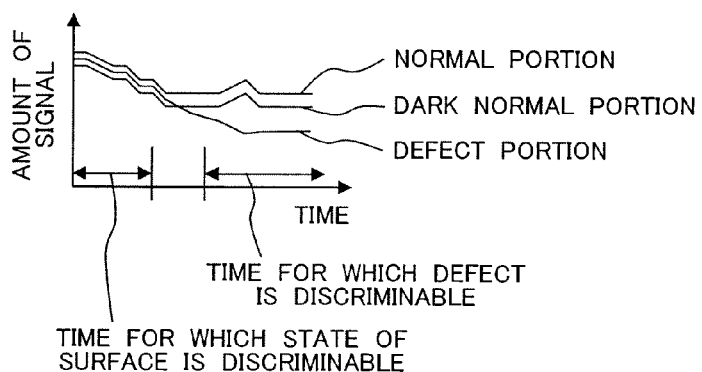
FIG. 9 is a sequence diagram for capturing an image used for a comparison inspection.
FIG. 10 is a graph showing a change in the amount of obtained signals with time.

FIG. 9 is a sequence diagram for capturing an image used for the comparison inspection. FIG. 10 is a graph showing a change in the amount of obtained signals with time. In FIG. 9, a line number (in which the finally obtained line is numbered in the order of coordinates in a case where a single image is captured by a plural number of times of electron beam scanning) is provided in the vertical direction and a line scanning order is represented by a number in a square showing an image. For example, in a line [1], a data-obtaining is performed four times in the fourth, seventh, tenth, and thirteenth line-scanning orders. These data are subjected to a weighted averaging. The contents of the weight are described below. In FIG. 10, the amount of signals obtained from the wafer 6 is decreased with the lapse of time. At the beginning, the wafer-surface state can be discriminated and thereafter the amount of signals is differently decreased between a normal portion and a defect portion due to a difference in a charging state caused by a difference in the structure of the region irradiated with the primary charged particle beam 2. This enables discriminating between the normal portion and the defect portion. Then, the weight of time for which inner information of the wafer can be available is increased. Contrarily, the weight of time for which only surface information of the wafer can be obtained is made negative, thereby the process using data added with a weight can provide more accurate information than the process using data added without a weight. By executing the inspection using information as to such a signal amount-transient characteristic, the inspection accuracy can be improved because of excluding an influence from image data including a large amount of surface information and increasing the inner information. The present embodiment is characterized in that the use of such a transient characteristic increases the inspection accuracy.

Figure 11:
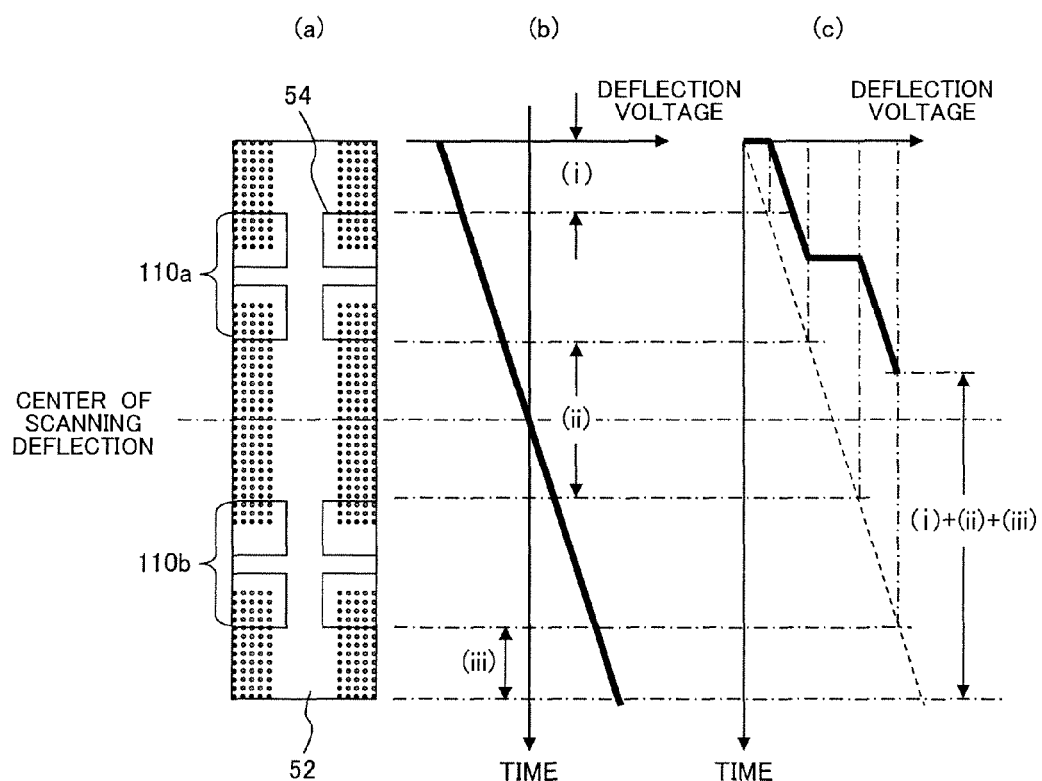
FIG. 11 is graphs showing a relationship between an image capturing region and a deflection voltage applied to a deflector.

The above description although is made on the premise that the whole ROI scan region 52 is irradiated with the primary charged particle beam and the region corresponding to the ROI capturing region 54 is extracted from the captured image and inspected, the inspection device may use a configuration in which only the ROI capturing region 54 is irradiated with the beam at the time of scanning the ROI scan region 52. FIG. 11 is a graph showing a relationship between the image-obtained region and the deflection voltage applied to the deflector 3 by the inspection device with a function of irradiating only the ROI capturing region 54 with the beam. As an example, described below is a method of controlling a primary charged particle beam scanning for imaging only regions 110a and 110b shown in (a) of FIG. 11. (b) of FIG. 11 shows the time waveform of a deflection voltage applied to the deflector 3 in a case where the whole ROI scan region 52 is imaged. The ordinate shows time and the abscissa shows the deflection voltage. Since the deflection voltage is zero (V) at the center of the scanning deflection, the deflection voltage is negative at the time of scanning the upper half of the ROI scan region 52 shown in (a) of FIG. 11, and the deflection voltage is positive at the time of scanning the lower half of the ROI scan region 52.

In the case of imaging only the regions 110a and 110b, as shown in (c) of FIG. 11, the deflection voltage applied to the scanning deflector 3 at a time of 0 is set to the voltage corresponding to a scanning beginning position (the upper end portion in the region 110a) in the region 110a. In other words, scanning is started in a state where a time region (i) shown in (b) of FIG. 11 is skipped. The deflection voltage increases with time. When the deflection voltage reaches the voltage corresponding to a scanning ending position in the region 110a (the lower end portion in the region 110a), the deflection voltage is stepwise changed to the voltage corresponding to a scanning beginning position in the region 110b (the upper end portion in the region 110b). Such a stepwise change corresponds to the skip of a time region (ii) shown in (b) of FIG. 11. Thereafter, the deflection voltage increases with time. When the deflection voltage reaches the voltage corresponding to a scanning ending position in the region 110b (the lower end portion in the region 110b), scanning of one line is finished. Thereafter, the deflecting-back deflection control to the stage movement direction resets the deflection voltage to the voltage in a position corresponding to the scan beginning position on the following scanning line. The above beam scanning control realizes the ROI control imaging only the regions 110a and 110b.

The above beam scanning control reduces a scanning time per one scanning line (a beam irradiation time) by time (i)+(ii)+(iii) shown in (c) of FIG. 11. In other words, the stage movement velocity Vs (substantially, V0) can be made faster by the above reduced time.

The above beam scanning control is realized such that the general control section 18 computes the time waveform of the deflection voltage based on the dimension and arrangement pitch of the memory mat 32 and arrangement information about the ROI capturing region 54 on the memory mat and controls the scanning deflector 3 based on the computed deflection voltage with the time waveform. Although the above description takes, as an example, a beam scanning control method in which only the regions 110a and 110b including two ROI capturing regions 54 are irradiated with the beam, it is to be understood that the beam scanning control can also be executed so as not to irradiate the region expect the ROI capturing region 54 in the regions 110a and 110b.

As described above, the inspection device of the present embodiment realizes the inspection device whose inspection speed is much higher than ever before.

Embodiment 2

The embodiment 1 describes the example in which the ROI capturing region 54 is set in the memory mat, a defect in which the device user is interested may be unevenly distributed in units of structure of a wafer larger in dimension than the visual field of the detection optical system, for example, in units of structure such as a die or a wafer with a dimension of mm order. In the present embodiment, an inspection method is described in a case where the ROI is set in units of structure larger than the one in the embodiment 1. The general configuration of the inspection device is substantially similar to that shown in FIG. 1, so that the description is not repeated.

Figure 12A:
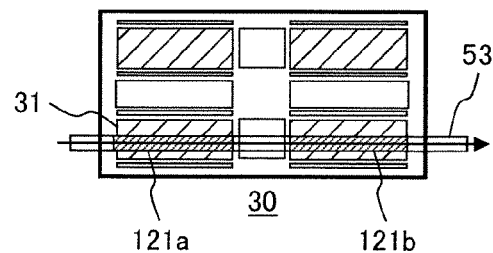
FIGS. 12A, 12B and 12C show a part of layout of an sample.
Figure 12B:
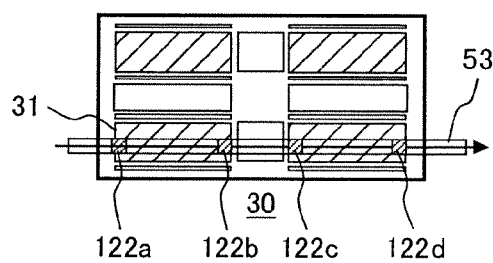
Figure 12C:
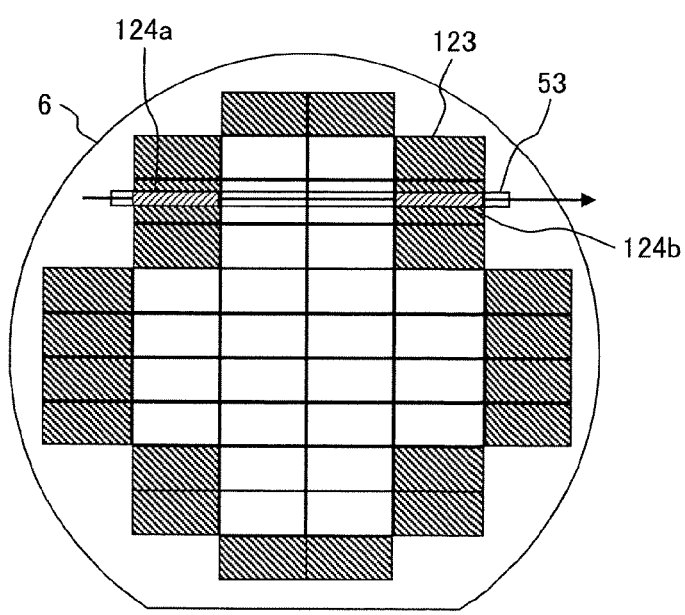

FIGS. 12A, 12B, and 12C show examples of arrangement of the ROI of the present embodiment on the die or the wafer. FIG. 12A is a chart showing a layout of part of the die to be inspected and shows an example where the inspection stripe 53 is arranged on the memory mat group 31. In FIG. 12A, the ROI being the interesting inspection region is only the memory mat group 31 in the memory mat regions 121a and 121b. In other words, the peripheral circuit portion excluding the memory mat group is thin in pattern and low in probability that a defect occurs, so that the peripheral circuit portion is excluded from our interest. FIG. 12B shows an example where the ROI is set in memory mat both-side regions 122a to 122d. In general, in the region where the rate of change in pattern density is high, defects tend to frequently occur. Therefore, defects tend to frequently occur in the both side region of the memory mat group. FIG. 12C shows an example where the ROIs are set in the dice around the periphery of the wafer. A wafer peripheral die 123 hatched in FIG. 12C causes defects more frequently than a wafer inner die because of different conditions for a manufacturing process, so that wafer peripheral region dice 124a and 124b are truly interesting regions.

In a case where an image is captured only in the aforementioned region, the region for an inspection image is set on the inspection region setting screen shown in FIG. 4 and the general control section 18 is caused to execute a stage movement control according to the information about the position in the set region. More specifically, the stage movement velocity V is made variable, only the above memory mat regions 121a and 121b, the memory mat both-side regions 122a to 122d, the wafer peripheral regions 124a and 124b are moved at a low velocity, and the regions other than those are moved at a high velocity. In other words, the sample stage is moved at a velocity higher than the velocity at which an image is detected in the region excepting a predetermined region on the same inspection stripe. This enables the inspection time to be made shorter than ever before.

Embodiment 3

In the present embodiment, another modification for setting an ROI capturing region is described below. The general configuration of the inspection device used in the present embodiment is similar to that shown in FIG. 1 as is the case with the embodiment 2.

Figure 13A:
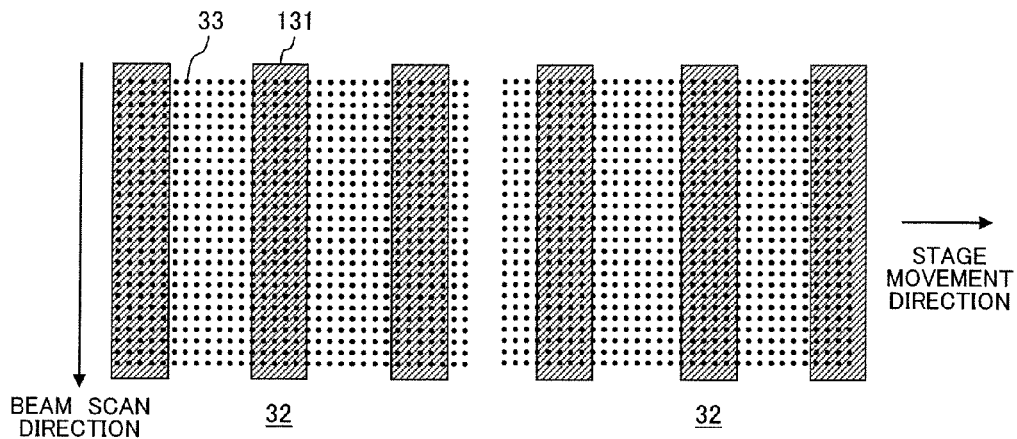
FIGS. 13A to 13B are plan views of a memory mat showing a procedure for sampling.

FIG. 13A is a schematic diagram showing the layout of the ROI capturing regions in the memory mat 32 in a case where each of the ROI capturing region 131 is set larger than the previously mentioned memory mat corner portion. In FIG. 13A, each of the ROI capturing regions 131 is set as a partial region 131 which is equal to the memory mat in vertical length (namely length in the direction where the beam is scanned) and includes approximately several memory cells in the length direction of the memory mat (namely, in the stage movement direction). The plurality of partial regions 131 (three partial regions in the present embodiment) are arranged in the length direction of the memory mat. In FIG. 13A, the area of the partial regions 131 set on the memory mat 32 accounts for approximately 40% of area of the memory mat. In a case where inspection images are sampled from the set region shown in FIG. 13A, there can be realized the stage movement and inspection speed which are faster by 2.5 times than those of typical whole surface inspection.

When the above inspection is performed, the visual filed region M is set to such a size as to include at least one memory mat 32 and the general control section 18 executes the stage control according to the length of the partial region 131 in the stage movement direction and the length of the skip region between the plurality of partial regions 131. The partial regions 131 are set on the inspection region setting screen shown in FIG. 4. A defect detection is executed by a method of using the golden image described in the embodiment 1 where the same pattern is repeated in the beam scanning direction and/or the stage movement direction. Furthermore, a method using an RIA method (described in Patent Document 3 and Non-Patent Document 1) in which the repetitive patterns are mutually subjected to averaging and the averaging-subjected images are arranged and taken as a reference image, and a die comparison using the same pattern for each die. As is the case with the embodiment 1, the golden image used for defect-detecting comparison computing is produced with the console 17 by computing the averaging value of the plurality of partial regions 131.

As shown in FIG. 13A, the partial regions 131 are not always set at equally spaced intervals. In that case, the displacement between the scanning line position and the beam irradiation position arranged in each partial region 131 is cancelled by any of the adjustment of the stage movement velocity or the control of amount of the deflecting-back deflection. In the case of adopting the adjustment of the stage movement velocity, there since may be problem in mechanical accuracy, it is more advantageous to adopt the control method of the deflecting-back deflection with high controllability.

Figure 13B:
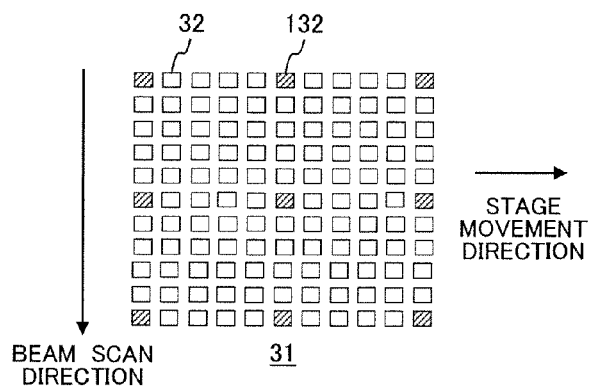

FIG. 13B is a schematic diagram showing a layout of the ROI capturing regions set at certain memory mats positioned in a plurality of memory mats forming a memory mat group in a case where each of the certain memory mats is set as a unit to be detected. In the example shown in FIG. 13B, the ROI capturing regions are set to several certain memory mats respectively at four corners of the memory mat group 31, at the mid-points of each side portions of the memory mat group 31, and at the center of the memory mat group 31. Furthermore, in a plurality of memory cells constituting each of memory mats selected as the ROI capturing regions as described above, memory cells at only each corner-region in all the memory cells are to be inspected. Thereby, it is possible to increase the speed of inspection in comparison with that of the embodiment 1 in accordance with the rate of selection of the memory mats.

According to the present embodiment, the inspection time is substantially made shorter than that in a case where the whole surface of the wafer is inspected because both of speed-up by image capturing for sampling in units of memory mat and speed-up by image capturing for sampling with specifying corner portions in the memory mat.

In the case of inspecting under the condition setting the ROI capturing regions shown in FIG. 13(b), required is the following two kinds of control parameters: one is a control parameter for performing the beam scanning control and the stage movement control in the memory mat 32; another is a control parameter for performing the beam scanning control and the stage movement control in a case where the visual filed region M is on the order of the memory mat group 31. More specifically, there are required parameters: information about the layout of corner portions (information about size and position of the rectangular region 44 shown in FIG. 4) and information about the dimension of the memory mat required for capturing images, only at the corner portions in the memory mat; information about the layout of memory mats specified in units in the memory mat group 31 to perform a sampling inspection (namely the information is about size and position of the specified memory mat in the memory mat group 31) and information about the dimension of the memory mat group. The above control parameters may be set through the GUI by appropriately switching the visual field size of the image to be displayed on the image display region 42 of the inspection region setting screen shown in FIG. 4. The set control information is transferred to the general control section 18 and used for the beam scanning control and the stage movement control.

Even if the above sampling is performed and if the occurrence of a defect is distributed, it is possible to capture the distribution. The present modification has an advantage in that a required defect distribution can be obtained and the inspection time can be made further shorter than ever before.

Embodiment 4

Figure 14:
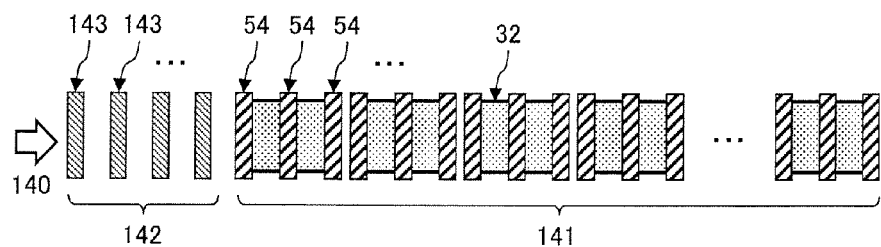
FIG. 14 is a diagram showing the inspection of a partial region of the memory mat 32.

In the present embodiment, still another modification for setting the ROI capturing region is described below. FIG. 14 shows the relationship of layout in a case where three ROI capturing regions are set in one memory mat. That is, in this embodiment, in order to inspect partially specified regions in the memory mat 32, the inspection is done by specifying the plural ROI capturing regions 54 to be irradiated for scanning with the charged particle beam in order by arrangement in the stage movement direction, and by scanning the specified ROI capturing regions in their arrangement order with the charged particle beam irradiation and the stage movement.

A plurality of memory mats 32 are arranged on the wafer, so that the ROI capturing regions 54 are regularly arranged in sequential inspection region 141. In addition, in a non-inspection region 142 including near an inspection start side-edge portion of the die and wide gaps existing in the arrangement of the memory mats 32, dummy inspection regions 143 are arranged as densely as the sequential inspection region 141. This "as densely as the sequential inspection region" means that the dummy inspection regions 143 are arranged based on a logic similar to the arrangement of the ROI capturing regions 54 by virtually assuming the repetition of the memory mat or the repetition of the die, or means that the dummy inspection regions 143 are arranged at regular intervals determined in accordance with the stage-velocity.

The arrangement of the dummy inspection regions enables electro static charge on the wafer 6 to be uniformly held by beam irradiation.

The dummy inspection regions 143 may be captured as images or may be only irradiated with the charged particle beam. The same effect can be expected by increasing the scanning interval of each charged particle beam instead of arranging the dummy inspection region 143 at regular intervals. It is needless to say that the same effect can be expected by performing scanning incompletely with the scanning interval of the charged particle beam increased, instead of completely scanning even between the ROI capturing regions 54.

In the above embodiments 1 to 4, description although is made using a method in which a defect is detected by comparing a previously obtained golden image 45 with a captured image of interest as to defect detection, any defect detection method may also be used such as actual pattern comparison methods such as cell comparison, RIA method, die comparison, and mat comparison, and a comparison method with a design pattern generated from design.

According to the present embodiment, it is possible to provide the inspection system capable of making high-speed image capturing time almost six times as speed as time required for normally capturing an image on a whole surface of the wafer and capable of inspecting a defect occurrence frequency distribution in the ROI region at a high throughput. Furthermore, the present embodiment can provide the inspection device and method for efficiently monitoring a defect occurrence frequency and a characteristic likelihood.

DESCRIPTION OF SYMBOLS

2: Primary charged particle beam, 3: Deflector, 4: Object lens, 5: Charging control electrode, 6: Wafer, 7: X-Y stage, 8: Z-sensor, 9: Sample table, 10: Secondary signal, 17: Defect determination section, 18: General control section, 19: Console, 20: Optical microscope, 21: Reference sample, 30: Die, 31: Memory mat group, 32: Memory mat, 33: Memory cell, 41: Map display region, 42: Image display region, 43: ROI condition setting section, 44: Rectangular region, 52: ROI scan region, 53: Inspection stripe, 54: ROI capturing region, 70: Map, 71: Image display portion, 72: Defect information display portion, 73: Mark, 74: Display threshold setting toolbar, 80: ROI capturing region image, 81: Golden image, 82: Difference image

The invention claimed is:

1. A charged particle beam device for scanning a sample using a charged particle beam to inspect the sample, the sample placed on a sample stage and having a plurality of pattern-regions each where a predetermined pattern is formed, wherein:
    the device is configured to scan the sample using the charged particle beam in a direction intersecting a sample stage-movement direction and capture an image based on signals obtained by detecting a secondary electron or a reflection electron generated on the sample by the scanning;
    the device is configured to inspect the sample using the captured image,
    the device includes a charged particle column including a scanning deflector for controlling the scanning direction of the charged particle beam, and a control section for controlling a movement velocity of the sample stage,
    the device is configured to set a plurality of scan regions arranged intermittently in an inspection stripe extended on the sample in a movement direction of the sample stage, the plurality of scan regions which are to be scanned by the charged particle beam for the captured image,
    the device is configured to set a plurality of partial inspection regions in each of the scan regions through a screen of a console, wherein each of the partial inspection regions includes edges to be inspected partially in each of ions on the sample, and
    the device is configured to sample the plurality of partial inspection regions including the edges from each of the scan regions by the scanning while the stage is being moved to capture the inspection image from the partial inspection regions.

2. The charged particle beam device according to claim 1, wherein the device is further configured to select the partial inspection regions including a first scan region and a second scan region, the first scan region from which a first image is captured by the scanning, and the second scan region from which a second image is captured later than the first image; and
    wherein the control section is configured to set the sample stage-movement velocity so that a scan ending edge of the first scan region and a scan beginning edge of the second scan region fall within a visual field in which aberrations and distortions of the scan ending edge and the scan beginning edge are regarded as the same respectively in a range of the charged particle beam scanning in the sample stage-movement direction.

3. The charged particle beam device according to claim 1, wherein the device is configured to set a scan skip region between the partial inspection regions, the scan skip region where the scanning is not executed by a skip.

4. The charged particle beam device according to claim 1, wherein the charged particle column is configured to execute the scanning while deflecting the charged particle beam in the same direction as the sample stage-movement direction to irradiate the inspection region selected by the sampling with the charged particle beam.

5. The charged particle beam device according to claim 1, further comprising:
    a screen display section for displaying a region setting screen for the sampling.

6. The charged particle beam device according to claim 1, wherein the sample stage is configured to place a semiconductor wafer on which a plurality of memory mats are formed, each memory mat being composed of a plurality of memory cells.

7. The charged particle beam device according to claim 6, further comprising:
    a display section for displaying a region setting screen for the sampling, the region setting screen being equipped with a display window on which one memory mat out of the plurality of memory mats is displayed,
    wherein the inspection region to be sampled set on the displayed memory mat is developed to another memory mat based on the regularity of arrangement of the memory cell to sample the plural inspection regions.

8. A charged particle beam device for scanning a sample using a charged particle beam to inspect the sample, the sample placed on a sample stage and having a plurality of pattern-regions each where a predetermined pattern is formed, wherein:
    the device is configured to scan the sample using the charged particle beam in a direction intersecting a sample stage-movement direction and capture an image based on signals obtained by detecting a secondary electron or a reflection electron generated on the sample by the scanning;
    the device configured to inspect the sample using the captured image;
    the device includes a control section for controlling a movement velocity of the sample stage;
    the device is configured to set a first scan region, a second scan region and a scan skip region in each of the pattern-regions, the first and second scan regions each where a plurality of scanning lines with the beam run sequentially for the scanning and the scan skip region where the scanning is not executed by a skip, wherein the scan skip region is arranged between the first and second scan regions; and the control section is configured to set the sample stage-movement velocity so that a scan ending edge of the first scan region and a scan beginning edge of the second scan region fall within a visual field in which aberrations and distortions of the scan ending edge and the scan beginning edge are regarded as the same respectively in a range of the charged particle beam scanning in the sample stage-movement direction.

9. The charged particle beam device according to claim 8, wherein the control section is configured to control the sample stage-movement velocity so that a width of each of the partial inspection regions in the sample-stage movement direction falls within the visual field.

10. A charged particle beam device for scanning a sample using a charged particle beam to inspect the sample, the sample placed on a sample stage and having a plurality of pattern-regions each where a predetermined pattern is formed wherein:
   the device is configured to scan the sample using the charged particle beam in a direction intersecting a sample stage-movement direction and capture an image based on signals obtained by detecting a secondary electron or a reflection electron generated on the sample by the scanning;
   the device is configured to inspect the sample using the captured image;
   the device includes a control section for controlling a movement velocity of the sample stage;
   the device is configured to set a scan region and a scan skip region in each pattern-region, the scan region where plural scanning lines with the beam run sequentially for the scanning and the scan skip region where the scanning is not executed by a skip; and
   the control section is configured to set the sample stage-movement velocity in accordance with a ratio of a width of the scan region to a width of the scan skip region in the sample stage-movement direction.

* * * * *